United States Patent
Kamijima

(10) Patent No.: US 7,146,712 B2
(45) Date of Patent: Dec. 12, 2006

(54) PATTERN FORMING METHOD AND METHOD OF MAKING MICRODEVICE

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 343 days.

(21) Appl. No.: 10/431,498

(22) Filed: May 8, 2003

(65) Prior Publication Data
US 2003/0219980 A1 Nov. 27, 2003

(30) Foreign Application Priority Data
May 24, 2002 (JP) ............... 2002-151339

(51) Int. Cl.
*G11B 5/187* (2006.01)
*B05D 3/04* (2006.01)
(52) U.S. Cl. .............. 29/603.13; 29/602.1; 29/603.08; 427/128; 427/126.6; 427/348; 360/126; 205/119; 205/220
(58) Field of Classification Search ........... 29/846, 29/603.07, 602.1, 603.13, 603.14, 603.08; 427/127, 128, 130, 131, 126.6, 348, 349; 204/192.2; 216/22; 360/126; 428/900; 205/119, 220, 221
See application file for complete search history.

(56) References Cited

U.S. PATENT DOCUMENTS 3,957,552 A * 5/1976 Ahn et al. ............... 216/22 X
5,525,205 A * 6/1996 Miyashita ................. 205/221
6,118,628 A * 9/2000 Sano et al. ................ 360/126
6,426,012 B1* 7/2002 O'Sullivan et al. .......... 216/22

FOREIGN PATENT DOCUMENTS

| JP | B2 56-36706 | | 8/1981 | |
| JP | 61-57042 | * | 3/1986 | ........... 427/130 |
| JP | 11-8235 | * | 1/1999 | |

OTHER PUBLICATIONS

Okumura et al., "Effects of ECR Ion Shower Treatment on the Magnetic and Recording Properties of CoCrTaPt Thin Film Media", IEEE Transactions on Magnetics, vol. 34, No. 4, Jul. 1998, pp. 1615-1617.*

* cited by examiner

Primary Examiner—A. Dexter Tugbang
(74) Attorney, Agent, or Firm—Oliff & Berridge, PLC

(57) ABSTRACT

A metal film made of a metal material (e.g., NiFe, CoFeNi, or FeCo) including an iron atom is formed on a substrate (S101). Subsequently, the metal film formed on the substrate is plasma-processed in an environment including a gas (e.g., an oxygen gas having a tetrafluoromethane or trifluoromethane gas added thereto) containing oxygen and fluorine atoms (S103). Then, a resist material (e.g., a chemically amplified positive resist material) is applied onto the plasma-processed metal film, so as to form a resist film (S105). Thereafter, the resist film is partly removed, so as to expose a part of the surface of metal film in conformity to a desirable pattern, thereby forming a resist frame (S107).

13 Claims, 11 Drawing Sheets

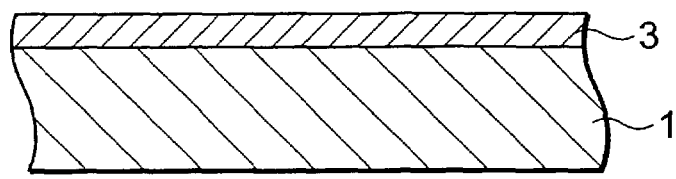
Fig.2A
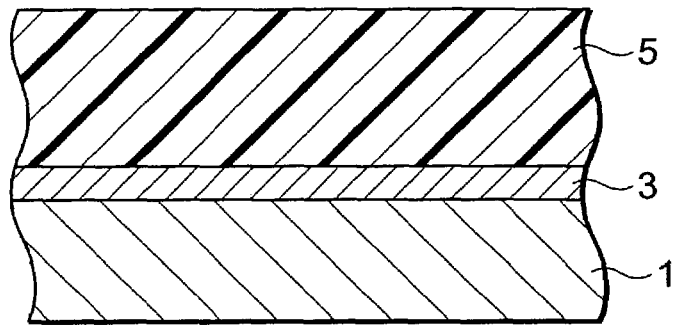
Fig.2B
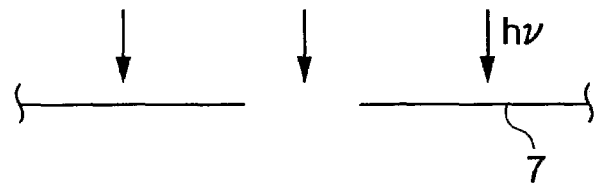
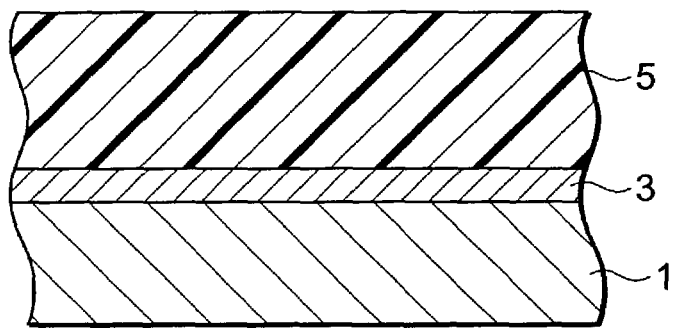
Fig.2C
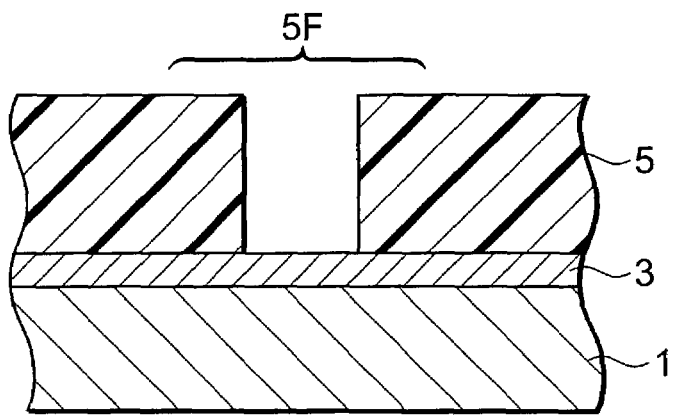
Fig.2D

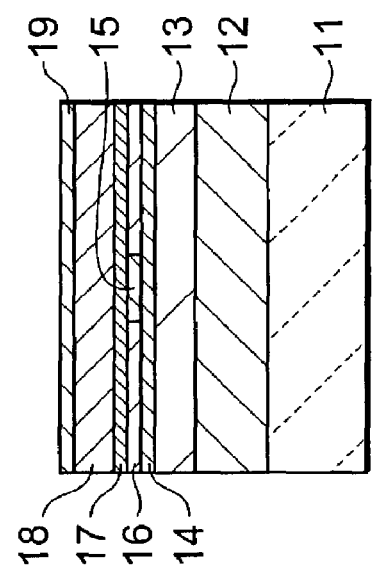
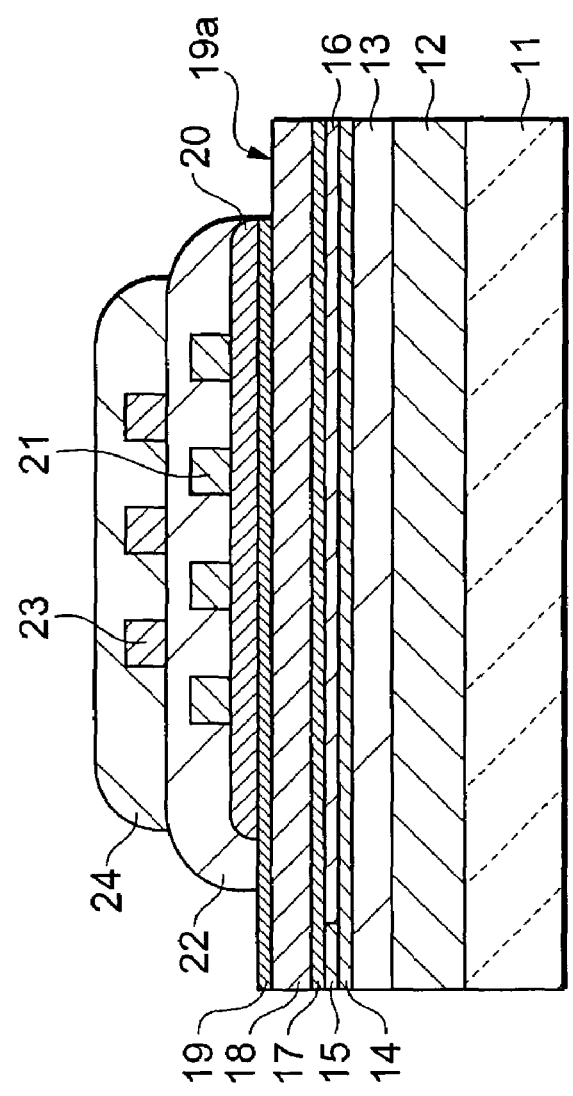

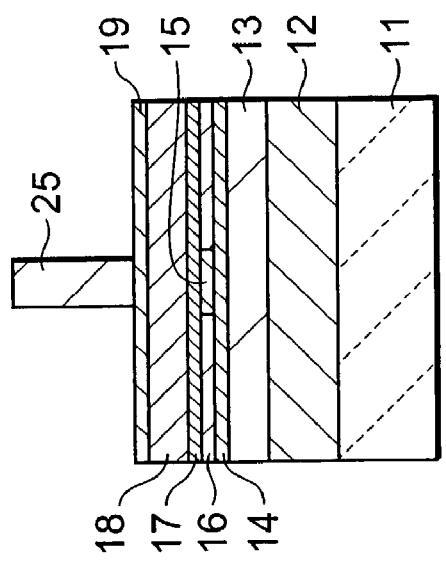
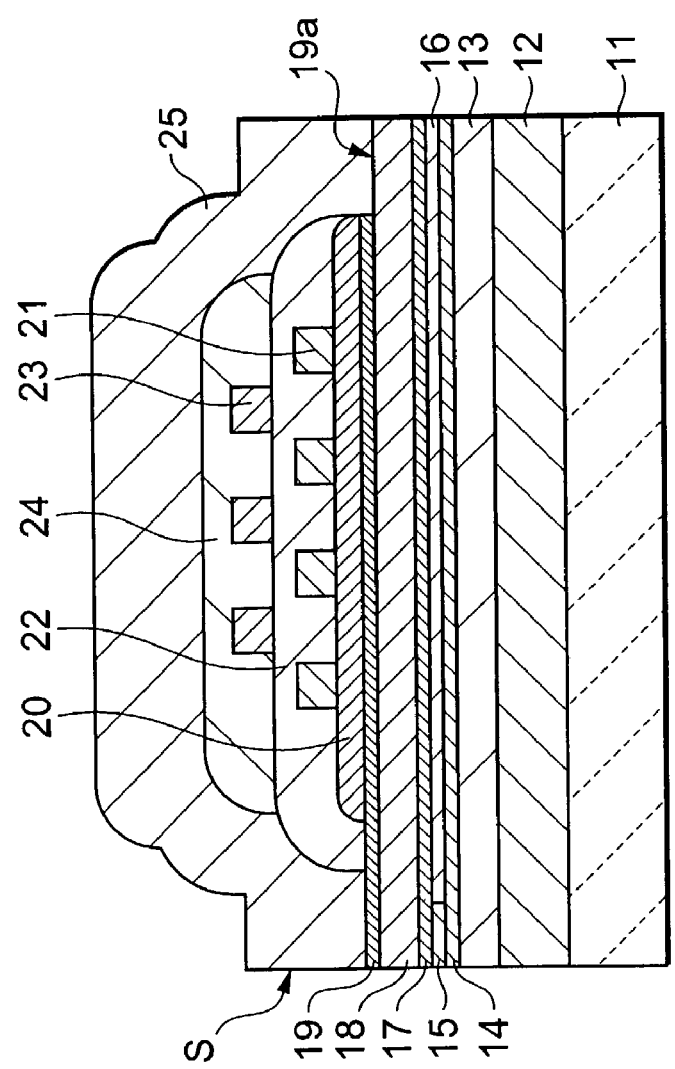

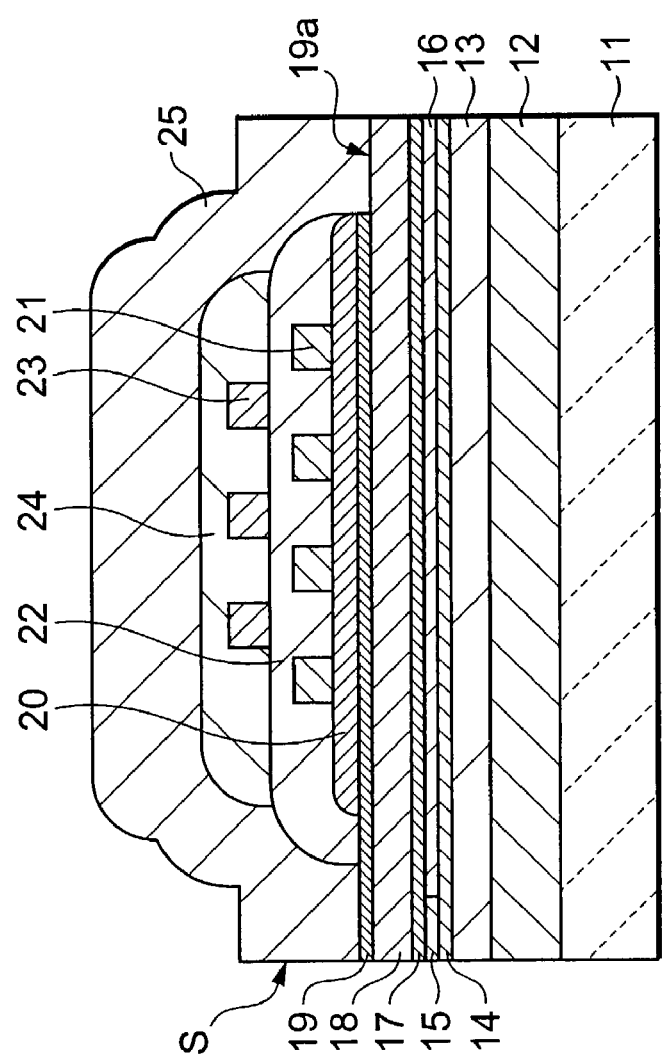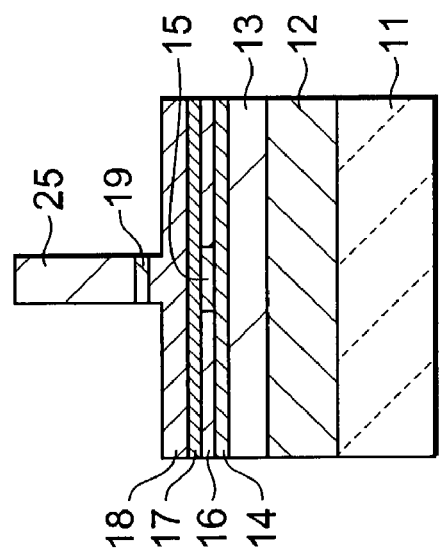

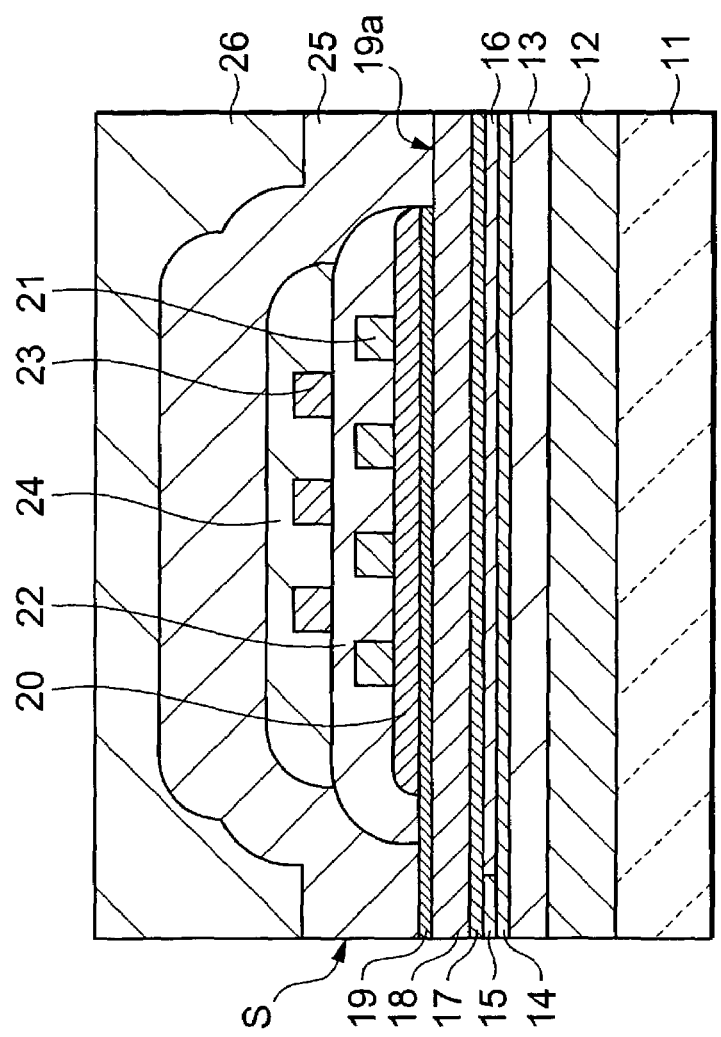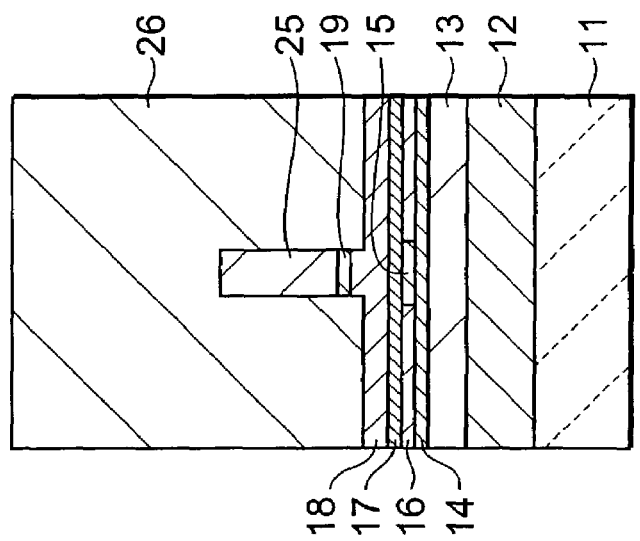

PATTERN FORMING METHOD AND METHOD OF MAKING MICRODEVICE

BACKGROUND OF THE INVENTION

1. Field of the Invention

The present invention relates to a pattern forming method for forming on a substrate a resist frame having a desirable pattern on a metal film made of a metal material including an iron atom, and a method of making a microdevice using the same. In the present invention, the microdevice encompasses thin-film magnetic heads, thin-film inductors, semiconductor devices, thin-film sensors, thin-film actuators, and apparatus incorporating them.

2. Related Background Art

Known as a method of forming a metal pattern on a substrate is so-called frame plating disclosed, for example, in Japanese Examined Patent Publication No. SHO 56-36706. This method comprises the steps of laminating a metal film on a substrate; forming a resist frame on the metal film so as to expose a desirable part of the metal film therethrough; plating a desirable metal layer on the electrode film exposed through the resist frame while using the metal film as an electrode; and removing the resist frame and a surplus of the metal film, so as to form a metal pattern on the substrate.

SUMMARY OF THE INVENTION

It has newly been found that the following problem may occur when a raw material for the metal film to be formed on the substrate is a metal material including an iron atom. When a resist frame exposing a desirable part of a metal film therethrough is formed on the metal film, residual scum may occur in the exposed part of the metal film, or the bottom part of resist frame near the metal film may be bellbottomed (if a positive resist material is used) or undercut (if a negative resist material is used). As a consequence, a favorable resist frame (resist pattern) may not be attained, whereby yield may deteriorate in subsequent manufacturing processes.

In view of such a problem, it is an object of the present invention to provide a pattern forming method and methods of making a microdevice, a thin-film magnetic head, a magnetic head slider, a magnetic head apparatus, and a magnetic recording and reproducing apparatus which can attain a favorable resist frame.

The present invention provides a pattern forming method for forming on a substrate a resist frame having a desirable pattern on a metal film made of a metal material including an iron atom, the method comprising the steps of forming the metal film made of a metal material including an iron atom on the substrate; plasma-processing the metal film in an environment including a gas containing oxygen and fluorine atoms; forming a resist film on the plasma-processed metal film; and forming a resist frame by removing a part of the resist film so as to expose a predetermined part of the metal film.

In the pattern forming method in accordance with the present invention, a metal film made of a metal material including an iron atom is plasma-processed in an environment including a gas containing oxygen and fluorine atoms, and a resist film is formed on the plasma-processed metal film. This prevents residual scum from occurring in the exposed part of the metal film and keeps the bottom part of resist frame near the metal film from being bellbottomed or undercut when a part of the resist film is removed so as to expose a predetermined part of the metal film. Therefore, a favorable resist frame can be obtained, whereby yield can be improved in subsequent manufacturing processes.

The fact that oxygen and fluorine atoms decrease the number of hydroxyl groups existing on the surface of the metal film seems to be a reason why the plasma processing in an environment including a gas containing oxygen and fluorine atoms forms no residual scum in the exposed part of metal film and keeps the bottom part of resist frame near the metal film from being bellbottomed or undercut.

Preferably, the resist film is formed by using a chemically amplified resist. Using a chemically amplified resist makes it easier for the bottom part of resist frame near the metal film to be bellbottomed or undercut. However, since the metal film is plasma-processed in an environment including a gas containing oxygen and fluorine atoms as mentioned above, the bottom part of resist frame near the metal film can reliably be prevented from being bellbottomed or undercut.

Preferably, the method further comprises the steps of forming a metal plating layer on the metal film by plating the exposed part of metal film with a metal material while using the resist frame as a mask; removing the resist frame; and removing the metal film while using the metal plating layer as a mask. Since residual scum is prevented from occurring in the exposed part of the metal film whereas the bottom part of resist frame near the metal film is kept from being bellbottomed or undercut in this case, adhesion can be improved between the metal film and the metal plating layer. Also, no scum exists as impurities between the metal film and the metal plating layer.

Preferably, the method further comprises the steps of removing the exposed part of metal film while using the resist frame as a mask; and removing the resist frame. Since residual scum is prevented from occurring in the exposed part of the metal film whereas the bottom part of resist frame near the metal film is kept from being bellbottomed or undercut in this case, the metal film can attain an appropriate form, and scum can be hindered from remaining as impurities on the substrate.

The present invention provides a method of making a microdevice comprising the steps of forming a metal film made of a metal material including an iron atom on a substrate; plasma-processing the metal film in an environment including a gas containing oxygen and fluorine atoms; forming a resist film on the plasma-processed metal film; and forming a resist frame by removing a part of the resist film so as to expose a predetermined part of the metal film.

In the method of making a microdevice in accordance with the present invention, a metal film made of a metal material including an iron atom is plasma-processed in an environment including a gas containing oxygen and fluorine atoms, and a resist film is formed on the plasma-processed metal film. This prevents residual scum from occurring in the exposed part of the metal film and keeps the bottom part of resist frame near the metal film from being bellbottomed or undercut when a part of the resist film is removed so as to expose a predetermined part of the metal film. Therefore, a favorable resist frame can be obtained, whereby yield can be improved in subsequent manufacturing processes.

Preferably, the resist film is formed by using a chemically amplified resist. Using a chemically amplified resist makes it easier for the bottom part of resist frame near the metal film to be bellbottomed or undercut. However, since the metal film is plasma-processed in an environment including a gas containing oxygen and fluorine atoms as mentioned above, the bottom part of resist frame near the metal film can reliably be prevented from being bellbottomed or undercut.

Preferably, the method further comprises the steps of forming a metal plating layer on the metal film by plating the exposed part of metal film with a metal material; removing the resist frame; and removing the metal film while using the metal plating layer as a mask. Since residual scum is prevented from occurring in the exposed part of the metal film whereas the bottom part of resist frame near the metal film is kept from being bellbottomed or undercut in this case, adhesion can be improved between the metal film and the metal plating layer. Also, no scum exists as impurities between the metal film and the metal plating layer.

Preferably, the method further comprises the steps of removing the exposed part of metal film while using the resist frame as a mask; and removing the resist frame. Since residual scum is prevented from occurring in the exposed part of the metal film whereas the bottom part of resist frame near the metal film is kept from being bellbottomed or undercut in this case, the metal film can attain an appropriate form.

The present invention provides a method of making a thin-film magnetic head, wherein the thin-film magnetic head is made as the microdevice by the above-mentioned method of making the same.

In the method of making a thin-film magnetic head in accordance with the present invention, the thin-film magnetic head is made as the microdevice by using the above-mentioned method of making the same. Namely, a metal film made of a metal material including an iron atom is plasma-processed in an environment including a gas containing oxygen and fluorine atoms, and a resist film is formed on the plasma-processed metal film. This prevents residual scum from occurring in the exposed part of the metal film and keeps the bottom part of resist frame near the metal film from being bellbottomed or undercut when a part of the resist film is removed so as to expose a predetermined part of the metal film. Therefore, a favorable resist frame can be obtained, whereby yield can be improved in subsequent manufacturing processes.

Preferably, the method further comprises the steps of forming a metal plating layer on the metal film by plating the exposed part of metal film with a metal material while using the resist frame as a mask; removing the resist frame; and removing the metal film while using the metal plating layer as a mask. Since residual scum is prevented from occurring in the exposed part of the metal film whereas the bottom part of resist frame near the metal film is kept from being bellbottomed or undercut in this case, adhesion can be improved between the metal film and the metal plating layer. Also, no scum exists as impurities between the metal film and the metal plating layer. Preferably, the thin-film magnetic head comprises a magnetic pole layer made of a metal material, while the magnetic pole layer is formed by the metal plating layer, whereby a magnetic pole layer can be obtained with high adhesion and less impurities.

The present invention provides a method of making a magnetic head slider comprising a thin-film magnetic head, wherein the thin-film magnetic head is made by the above-mentioned method of making the same.

The present invention provides a method of making a magnetic head apparatus including a thin-film magnetic head and a head supporting apparatus for supporting the thin-film magnetic head, wherein the thin-film magnetic head is made by using the above-mentioned method of making the same.

The present invention provides a method of making a magnetic recording and reproducing apparatus comprising a magnetic head apparatus including a thin-film magnetic head and a head supporting apparatus for supporting the thin-film magnetic head, and a magnetic recording medium for carrying out magnetic recording and reproducing in cooperation with the thin-film magnetic head, wherein the magnetic head apparatus is made by using the above-mentioned method of making the same.

In the methods of making a magnetic head slider, a magnetic head apparatus, and a magnetic recording and reproducing apparatus in accordance with the present invention, a metal film made of a metal material including an iron atom is plasma-processed in an environment including a gas containing oxygen and fluorine atoms, and a resist film is formed on the plasma-processed metal film. This prevents residual scum from occurring in the exposed part of the metal film and keeps the bottom part of resist frame near the metal film from being bellbottomed or undercut when a part of the resist film is removed so as to expose a predetermined part of the metal film. Therefore, a favorable resist frame can be obtained, whereby yield can be improved in subsequent manufacturing processes.

When the resist film is formed by using a chemically amplified resist material, the bottom part of resist frame near the metal film can reliably be prevented from being bellbottomed or undercut.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2A to 2D are sectional views for explaining steps in an example of the pattern forming method in accordance with the first embodiment;

FIGS. 6A and 6B are sectional views for explaining a step in an example of the method of making a combination thin-film magnetic head in accordance with a third embodiment;

FIGS. 7A and 7B are sectional views for explaining a step subsequent to that shown in FIGS. 6A and 6B;

FIGS. 8A and 8B are sectional views for explaining a step subsequent to that shown in FIGS. 7A and 7B;

FIGS. 9A and 9B are sectional views for explaining a step subsequent to that shown in FIGS. 8A and 8B;

DESCRIPTION OF THE PREFERRED EMBODIMENTS

In the following, preferred embodiments of the present invention will be explained in detail with reference to the accompanying drawings. In the explanation of the drawings, constituents identical or equivalent to each other will be referred to with numerals identical to each other, without repeating their overlapping descriptions.

First Embodiment

Figure 1:
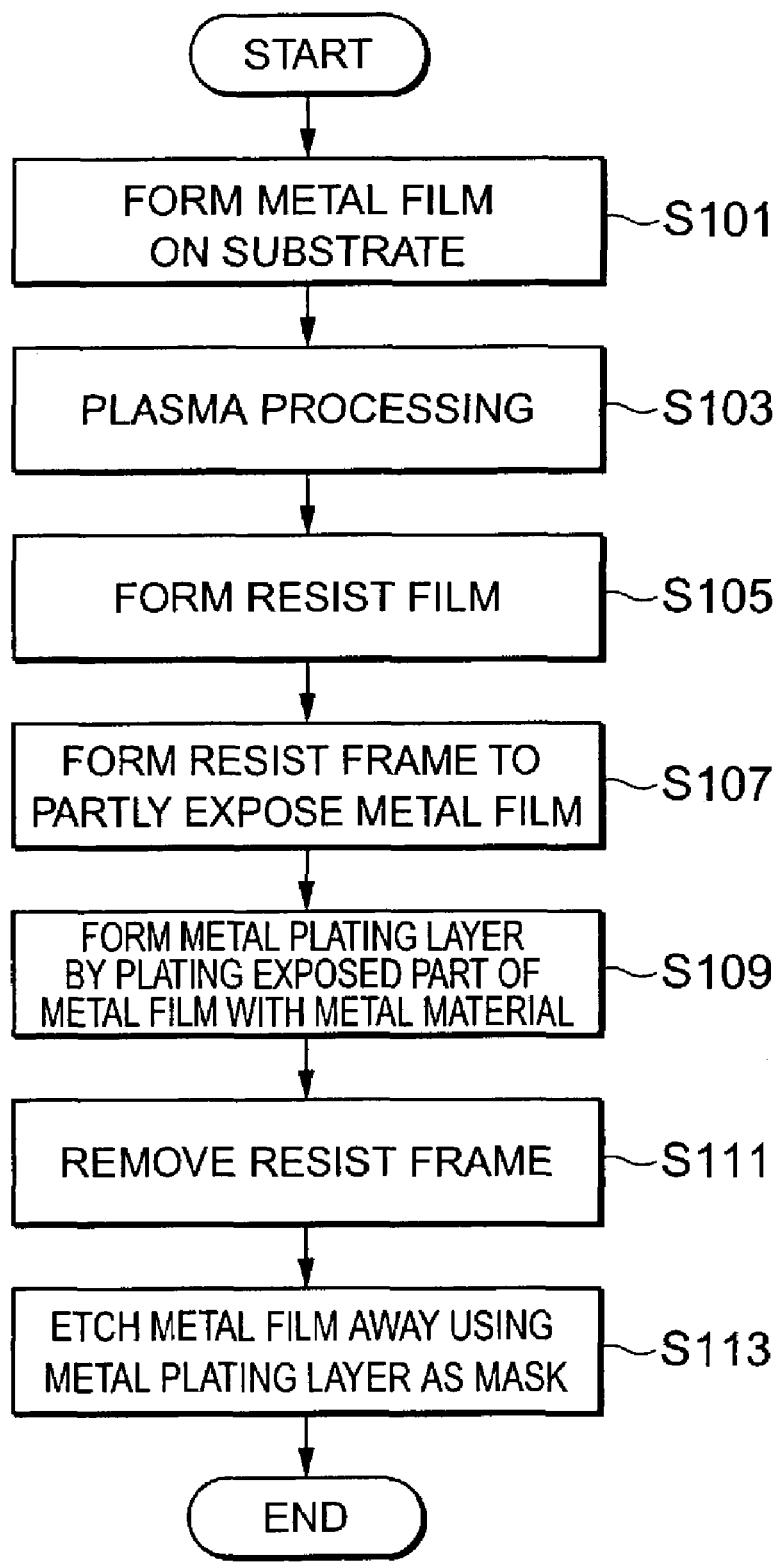
FIG. 1 is a flowchart showing the pattern forming method in accordance with a first embodiment.

To begin with, the pattern forming method in accordance with a first embodiment will be explained. FIG. 1 is a flowchart showing the pattern forming method in accordance with this embodiment, whereas FIGS. 2A to 2D and 3A to 3C are sectional views for explaining this pattern forming method.

First, as shown in FIG. 2A, a substrate 1 is prepared, and a metal film 3 made of a metal material (e.g., NiFe, CoFeNi, or FeCo) including an iron (Fe) atom is formed thereon (S101). Sputtering or the like, for example, can be used for forming the metal film 3.

Subsequently, the metal film 3 formed on the substrate 1 is plasma-processed in an environment including a gas (e.g., an oxygen ($O_2$) gas having a tetrafluoromethane ($CH_4$) or trifluoromethane ($CHF_3$) gas added thereto) containing oxygen (O) and fluorine (F) atoms (S103) The plasma processing is carried out such that the substrate 1 formed with the metal film 3 is exposed to the ionized gas containing oxygen (O) and fluorine (F) atoms. Any pumping method for ionizing the gas and any kind of plasma are employable, such as inductive coupling plasma caused by radio waves at a high frequency, capacitive coupling plasma, and surface wave plasma using microwaves.

Then, as shown in FIG. 2B, a resist material (e.g., a chemically amplified positive or negative resist material) is applied onto the plasma-processed metal film 3, so as to form a resist film 5 (S105). Here, the applied resist material may be heat-treated when necessary.

Next, as shown in FIG. 2C, the resist film 5 is exposed to light by way of a mask 7 corresponding to a desirable pattern, whereby a latent image of a pattern corresponding to the desirable pattern is transferred to the resist film 5. The resist film 5 having the latent image transferred thereto is developed, rinsed with water, and dried, so as to remove a part of the resist film 5 such that a part of the surface of the metal film 3 is exposed in conformity to the desirable pattern, whereby a resist frame 5F is formed as shown in FIG. 2D (S107). If necessary, the resist material may be heat-treated after the transfer before the development.

Figure 3A:
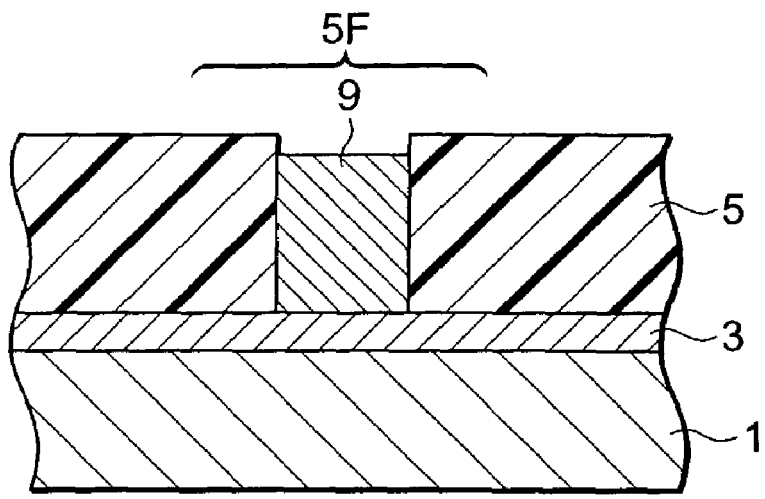
FIGS. 3A to 3C are sectional views for explaining steps in the example of the pattern forming method in accordance with the first embodiment.

Subsequently, by way of the resist frame 5F acting as a mask, the surface of the exposed part of metal film 3 surrounded by the resist frame 5F is plated with a metal material while using the metal film 3 as an electrode, so as to form a metal plating layer 9 on the metal film 3 as shown in FIG. 3A (S109). If necessary, the exposed surface of the metal film 3 may be pretreated with an acid or the like before plating.

Figure 3B:
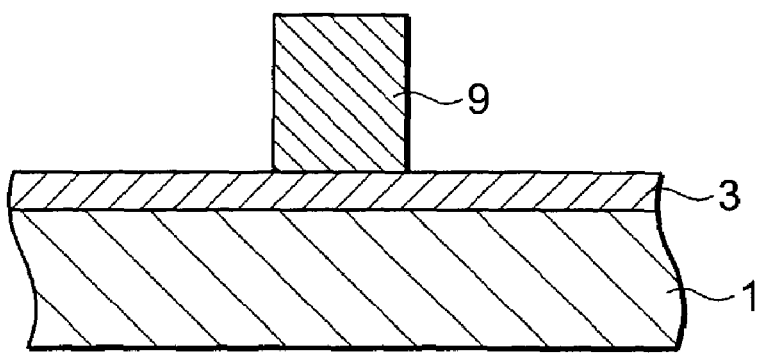

Then, as shown in FIG. 3B, the resist frame 5F is removed (S111). Here, dissolving with an organic solvent, ashing, or the like, for example, can remove the resist frame 5F.

Figure 3C:
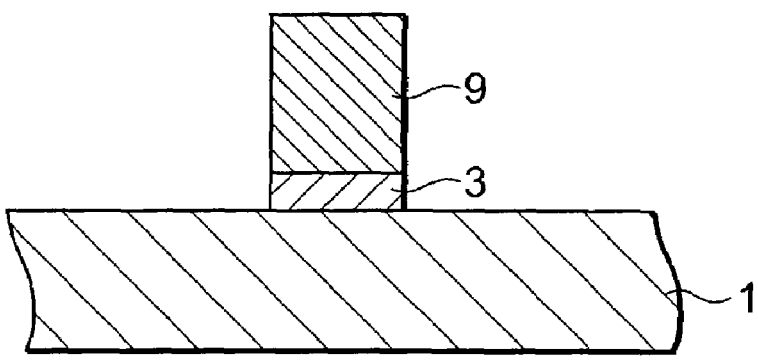

Next, as shown in FIG. 3C, the part of metal film 3 exposed to the surface is etched away while using the metal plating layer 9 as a mask, so as to expose the substrate 1 (S113). Milling, dry etching such as reactive ion etching, or wet etching can be employed for etching the metal film 3 away. The foregoing completes the pattern forming method of this embodiment.

In such a pattern forming method, the metal film 3 made of a metal material including an iron atom is plasma-processed in an environment including a gas containing oxygen and fluorine atoms, and the resist film 5 is formed on the plasma-processed metal film 3. This prevents residual scum from occurring in the exposed part of the metal film 3 and keeps the bottom part of resist frame 5F near the metal film 3 from being bellbottomed or undercut when a part of the resist film 5 is removed so as to expose a predetermined part of the metal film 3. Therefore, a favorable resist frame 5F can be obtained, whereby yield can be improved in subsequent manufacturing processes.

In this embodiment, the resist film 5 is formed by using a chemically amplified resist material. Using a chemically amplified resist makes it easier for the bottom part of resist frame near the metal film 3 to be bellbottomed or undercut. However, since the metal film 3 is plasma-processed in an environment including a gas containing oxygen and fluorine atoms as mentioned above, the bottom part of resist frame near the metal film can reliably be prevented from being bellbottomed or undercut.

In this embodiment, the exposed part of metal film 3 is plated with a metal material while using the resist frame 5F as a mask, so as to form the metal plating layer 9 on the metal film 3, the resist frame 5F is removed thereafter, and then the exposed part of metal film 3 is removed while using the metal plating layer 9 as a mask. This prevents residual scum from occurring in the exposed part of the metal film 3 and keeps the bottom part of resist frame near the metal film 3 from being bellbottomed or undercut, whereby adhesion can be improved between the metal film 3 and the metal plating layer 9. Also, no scum exists between the metal film 3 and the metal plating layer 9.

As Examples and Comparative Examples of the pattern forming method in accordance with this embodiment, metal plating layers having a desirable pattern were formed as follows:

EXAMPLE 1

Using a substrate made of Si having a diameter of 3 inches and a thickness of about 0.4 mm, a metal plating layer (including a metal film) having a desirable pattern was formed.

First, as a metal film, a permalloy (NiFe) film was formed by about 100 nm. The ratio between Ni and Fe was 50/50 wt % (% by weight). For forming the permalloy film, sputtering was employed with SPF-740H (DC sputtering apparatus) manufactured by Anelva Corp. with a permalloy target (having a target diameter of 8 inches), a power of 1500 W, an argon gas flow rate of 15 sccm (standard cubic cm: flow rate in terms of $cm^3$ per minute at the pressure converted to 1 atm ($1.01325 \times 10^5$ Pa)), and a pressure of 0.25 Pa. The deposition rate of permalloy was about 15 nm/sec.

Subsequently, the permalloy film, together with the substrate, was plasma-processed in an environment including a gas containing oxygen and fluorine atoms. The plasma processing was carried out by using System 104 manufactured by Matrix Integrated Systems, Inc. at a pressure of 133.322 Pa (1 Torr), a power of 100 W, an oxygen gas flow rate of 20 sccm, and a tetrafluoromethane gas flow rate of 5 sccm. The substrate temperature was 50° C., whereas the processing time was 30 sec.

Next, AZDTF-11 manufactured by Clariant (Japan) K.K. was applied as a resist material, so as to form a resist film. Here, a film thickness of about 4 μm was attained by spin coating, and thus formed film was prebaked for about 180 seconds at 110° C. on a hot plate or the like. As the resist material, SEPR-I020 manufactured by Shin-Etsu Chemical Co., Ltd. may also be used. Both AZDTF-11 and SEPR-I020mentioned above are chemically amplified positive resist materials.

Next, using a mask with a pattern whose clear part had a width of 0.3 μm, the resist film was exposed to light and developed, so as to form a resist frame.

Here, NSR-EX14CTFH manufactured by Nikon Corp. was used as an exposure apparatus with an NA (numerical aperture) of 0.4, σ (ratio between illumination system NA/lens NA) of 0.4, and exposure light quantity of 120 mJ/cm$^2$. The ambient temperature was 80° C., whereas the exposure time was 90 sec. In the case where SEPR-I020 manufactured by Shin-Etsu Chemical Co., Ltd. was used as the resist material, the exposure light quantity was 200 mJ/cm$^2$.

The development was carried out three times, each for 60 seconds, by a puddle process using a 2.38% TMAH (tetramethyl ammonium hydroxide) aqueous solution, followed by rinsing with water and drying.

Subsequently, as pretreatment for plating, the substrate formed with the permalloy film and resist frame was washed with a 5% HCl aqueous solution and then rinsed with water.

Next, using a permalloy plating bath with a plating solution containing the ingredients and contents shown in the following Table 1, permalloy was formed with a thickness of about 4 μm, rinsed with water, and then dried. The plating was carried out with a bath temperature of 40° C., a current density of $3.5 \times 10^{-3}$ A/cm$^2$, and an anode made of permalloy.

TABLE 1

| INGREDIENT | CONTENT |
|---|---|
| NICKEL SULFATE NiSO$_4$.6H$_2$O | 350 g/LITER |
| FERROUS SULFATE FeSO$_4$.7H$_2$O | 10 g/LITER |
| BORIC ACID H$_3$BO$_3$ | 30 g/LITER |
| AMMONIUM CHLORIDE NH$_4$Cl | 20 g/LITER |
| SACCHARIN SODIUM C$_7$H$_4$NNaO$_3$S.2H$_2$O | 1 g/LITER |
| SODIUM LAURYL SULFATE CH$_3$(CH$_2$)$_{11}$OSO$_3$Na | 0.05 g/LITER |

Subsequently, the resist frame was dissolved with acetone and removed. The resulting product was dried, whereby a plating pattern (metal plating layer) with an isolated line made of permalloy having a width of about 0.3 μm and a height of about 4 μm was obtained.

The permalloy plating pattern obtained in this example was observed here. Neither abnormality nor peeling of the plating pattern was seen. Thus, a favorable permalloy plating pattern was obtained.

Next, the substrate was immersed and swung in acetone, so as to dissolve and remove the resist frame.

Then, using the permalloy plating pattern as a mask, the permalloy film was etched away by milling, so as to expose the substrate. For removing the permalloy, an 8C milling apparatus manufactured by Commonwealth Scientific Corp. was used with a power of 500 W, a current of 500 mA, a pressure of 0.4 Pa, and a milling angle of 10°.

In this example, after the resist pattern (with a thickness of 4 μm and a width of 0.3 μm) having an isolated trench was formed, the product was observed in terms of whether residual scum occurred in the exposed part of permalloy film or not, and whether the bottom part of permalloy film near the permalloy film was bellbottomed or not. As a result of observation, no residual scum was found, the bottom part of resist frame was not bellbottomed, and a favorable resist pattern was obtained.

EXAMPLE 2

The same conditions as with Example 1 were used except that a trifluoromethane gas was used instead of the tetrafluoromethane gas. No residual scum was found, the bottom part of resist frame was not bellbottomed, and a favorable resist pattern was obtained in this case as well.

COMPARATIVE EXAMPLE 1

The same conditions as with Example 1 were used except that no plasma processing was carried out. In this case, residual scum was seen in the exposed part of permalloy film, and the bottom part of resist frame was bellbottomed.

COMPARATIVE EXAMPLE 2

The same conditions as with Example 1 were used except that a gas containing oxygen atoms but no fluorine atoms was used for plasma processing. In this case, residual scum was seen in the exposed part of permalloy film, and the bottom part of resist frame was bellbottomed.

COMPARATIVE EXAMPLE 3

The same conditions as with Example 1 were used except that a gas containing oxygen atoms but no fluorine atoms was used for plasma processing, and that the power in plasma processing was raised to 200 W. In this case, residual scum was seen in the exposed part of permalloy film, and the bottom part of resist frame was bellbottomed.

COMPARATIVE EXAMPLE 4

The same conditions as with Example 1 were used except that a gas containing fluorine atoms but no oxygen atoms was used for plasma processing. In this case, residual scum was seen in the exposed part of permalloy film, and the bottom part of resist frame was bellbottomed.

COMPARATIVE EXAMPLE 5

The same conditions as with Example 1 were used except that an Ar (argon) gas was used for plasma processing. In this case, residual scum was seen in the exposed part of permalloy film, and the bottom part of resist frame was bellbottomed.

COMPARATIVE EXAMPLE 6

Here, Ni was used as the metal material for the metal film and metal plating layer. The same conditions as with Example 1 were used except that no plasma processing was carried out. No residual scum was found in the exposed part of Ni film, the bottom part of resist frame was not bellbottomed, and a favorable resist pattern was obtained.

When each of resist frames formed under the conditions of Example 1 while using CoFeNi (65/20/15 wt %) or FeCo (70/30 wt %) as the metal material for the metal film was observed, no residual scum was found in the exposed part of metal film, the bottom part of resist frame was not bellbottomed, and a favorable resist pattern was obtained. Results similar to those obtained when the permalloy film was used as the metal material for the metal film were obtained in Example 2 and Comparative Examples 1 to 3 as well.

Second Embodiment

Figure 4:
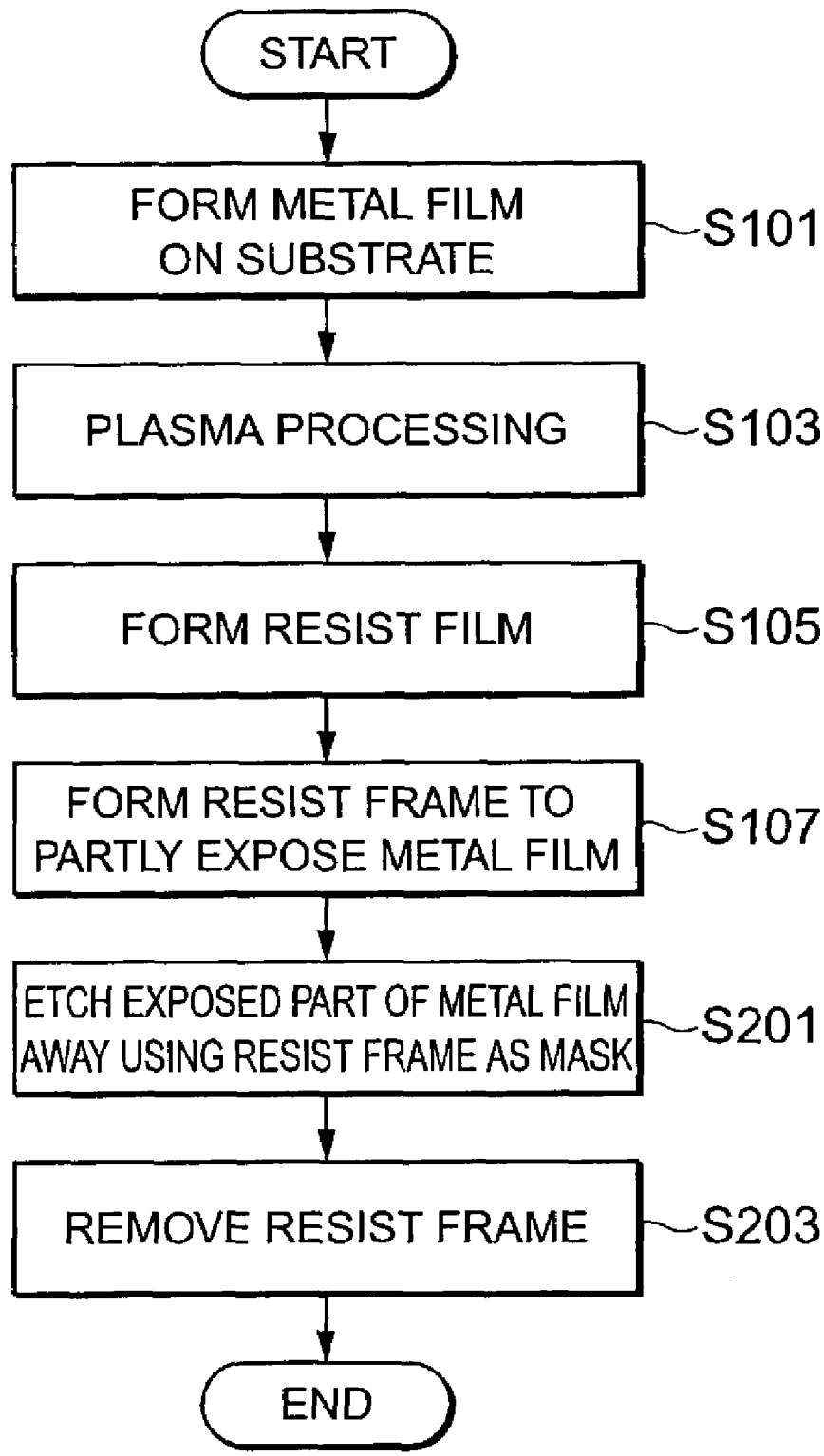
FIG. 4 is a flowchart showing the pattern forming method in accordance with a second embodiment.

The pattern forming method in accordance with a second embodiment will now be explained. FIG. 4 is a flowchart showing the pattern forming method in accordance with this embodiment, whereas FIGS. 5A and 5B are sectional views for explaining this pattern forming method.

Steps S101 to S107 are the same as those of the above-mentioned first embodiment and thus will not be explained, whereas steps subsequent thereto will now be explained.

Figure 5A:
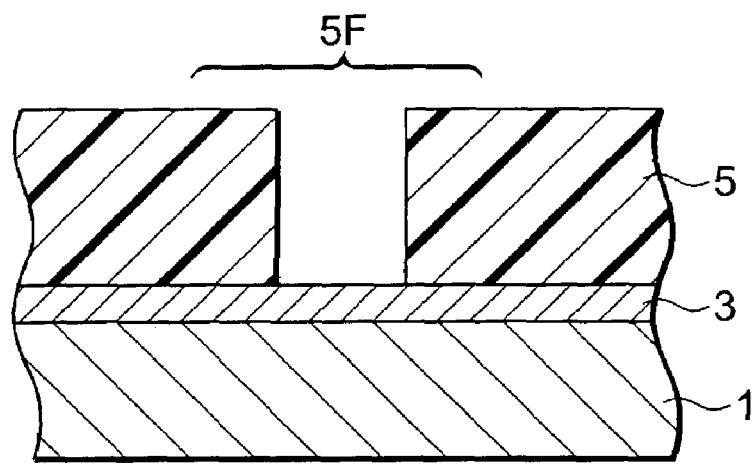
FIGS. 5A and 5B are sectional views for explaining steps in an example of the pattern forming method in accordance with the second embodiment.

After the resist frame 5F is formed, the metal film 3 exposed to the surface was etched away while using the resist frame 5F as a mask (S201) as shown in FIG. 5A. Milling, dry etching such as reactive ion etching, and wet etching can be employed for etching the metal film 3 away.

Figure 5B:
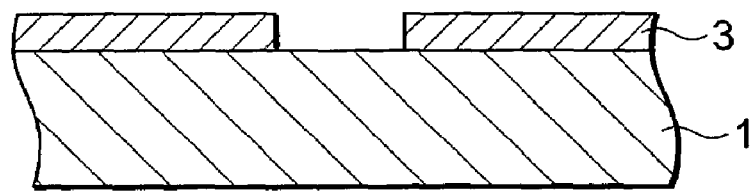

Subsequently, as shown in FIG. 5B, the resist frame 5F is removed (S203). Here, for example, dissolving with an organic solvent, ashing, or the like can remove the resist frame 5F. The foregoing completes the pattern forming method of this embodiment.

Such a pattern forming method, as with the above-mentioned first embodiment, prevents residual scum from occurring in the exposed part of metal film 3 and keeps the bottom part of resist frame 5F near the metal film 3 from being bellbottomed or undercut. Therefore, the favorable resist frame 5F can be obtained, and yield can be improved in subsequent manufacturing processes.

Also, even when a chemically amplified resist material is used, the bottom part of resist frame near the metal film 3 can reliably be prevented from being bellbottomed or undercut.

In this embodiment, the exposed part of metal film 3 is removed while using the resist frame 5F as a mask, and then the resist frame 5F is removed. This prevents residual scum from occurring in the exposed part of the metal film 3 and keeps the bottom part of resist frame near the metal film 3 from being bellbottomed or undercut, whereby the metal film 3 can attain an appropriate form.

As an example of the pattern forming method in accordance with this embodiment, a metal plating layer having a desirable pattern was formed as follows:

Using a substrate made of Si having a diameter of 3 inches and a thickness of about 0.4 mm, a metal plating layer having a desirable pattern was formed.

First, as a metal film, a permalloy (NiFe) film was formed by about 100 nm. The ratio between Ni and Fe was 50/50 wt % (% by weight). For forming the permalloy film, sputtering was employed with SPF-740H (DC sputtering apparatus) manufactured by Anelva Corp. with a permalloy target (having a target diameter of 8 inches), a power of 1500 W, an argon gas flow rate of 15 sccm (standard cubic cm: flow rate in terms of $cm^3$ per minute at the pressure converted to 1 atm ($1.01325 \times 10^5$ Pa) ), and a pressure of 0.25 Pa. The deposition rate of permalloy was about 15 nm/sec.

Subsequently, the permalloy film, together with the substrate, was plasma-processed in an environment including a gas containing oxygen and fluorine atoms. The plasma processing was carried out by using System 104 manufactured by Matrix Integrated Systems, Inc. at a pressure of 133.322 Pa (1 Torr), a power of 100 W, an oxygen gas flow rate of 20 sccm, and a tetrafluoromethane gas flow rate of 5 sccm. The substrate temperature was 50° C., whereas the processing time was 30 sec.

Next, AZ5105P manufactured by Clariant (Japan) K.K. was applied as a resist material, so as to form a resist film. Here, a film thickness of about 0.5 μm was attained by spin coating, and thus formed film was prebaked for about 60 seconds at 130° C. on a hot plate or the like. AZ5105P is a chemically amplified positive resist material.

Next, using a mask with a pattern whose clear part had a width of 0.2 μm, the resist film was exposed to light and developed, so as to form a resist frame.

Here, NSR-EX14CTFH manufactured by Nikon Corp. was used as an exposure apparatus with an NA (numerical aperture) of 0.6, σ (ratio between illumination system NA/lens NA) of 0.75, exposure light quantity of 20 $mJ/cm^2$, and focal point at 0.0 μm. The ambient temperature was 130° C., whereas the exposure time was 60 sec.

The development was carried out by a single puddle process using a 2.38% TMAH (tetramethyl ammonium hydroxide) aqueous solution for 60 seconds, followed by rinsing with water and drying.

Subsequently, using the resist frame as a mask, the permalloy film was etched away by reactive ion etching, so as to expose the substrate. Here, the permalloy film was removed by using HG6000 manufactured by Hitachi Metals, Ltd. with a pressure of 0.4 Pa (3 mTorr), an argon gas flow rate of 100 sccm, a microwave output of 1000 W, and a high frequency output of 50 W.

Then, the substrate was immersed and swung in acetone, so as to dissolve and remove the resist frame.

In this example, after the resist pattern (with a thickness of 0.5 μm and a width of 0.2 μm) having an isolated trench was formed, the product was observed in terms of whether residual scum occurred in the exposed part of permalloy film or not, and whether the bottom part of permalloy film near the permalloy film was bellbottomed or not. As a result of observation, no residual scum was found, the bottom part of resist frame was not bellbottomed, and a favorable resist pattern was obtained.

Third Embodiment

Methods of making a thin-film magnetic head, a magnetic head slider, a magnetic head apparatus, and a magnetic recording and reproducing apparatus as microdevices in accordance with a third embodiment will now be explained. The method of making a thin-film magnetic head in accordance with the third embodiment is a method of forming a magnetic pole of a thin-film magnetic head by using the pattern forming method in accordance with the first embodiment.

First, with reference to FIGS. 6A to 9B, an example of the method of making a combination thin-film magnetic head in accordance with this embodiment will be explained. In FIGS. 6A to 9B, the drawings suffixed with A (FIGS. 6A to 9A) show cross sections perpendicular to the air bearing surface, whereas those suffixed with B (FIGS. 6B to 9B) show cross sections parallel to the air bearing surface in a magnetic pole part.

As shown in FIGS. 6A and 6B, on a substrate 11 made of a ceramic material such as AlTiC ($Al_2O_3 \cdot TiC$), an insulating layer 12 made of an insulating material such as alumina ($Al_2O_3$) or silicon dioxide ($SiO_2$) is initially formed by a thickness of 1 to 20 μm, for example, by sputtering or the like in the method of making a thin-film magnetic head in accordance with this example. Subsequently, on the insulating layer 12, a lower shield layer 13 made of a magnetic material for a reproducing head is formed with a thickness of 0.1 to 5 μm, for example. The magnetic material used for the lower shield layer 13 is FeAlSi, NiFe, CoFe, CoFeNi, FeN, FeZrN, FeTaN, CoZrNb, CoZrTa, or the like. The lower shield layer 13 is formed by sputtering, plating, or the like.

Then, on the lower shield layer 13, a lower shield gap film 14 made of an insulating material such as $Al_2O_3$ or $SiO_2$ is formed with a thickness of about 10 to 20 nm, for example. Subsequently, on the lower shield gap film 14, an MR device 15 for reproducing is formed with a thickness of several tens of nanometers, for example, by sputtering or the like. Magnetosensitive devices exhibiting magnetoresistance effects such as AMR device, GMR device, and TMR (tunneling magnetoresistive) device can be used for the MR device 15. Then, on the lower shield gap film 14, a pair of electrode layers 16 electrically connected to the MR device 15 are formed with a thickness of several tens of nanometers by sputtering or the like. Thereafter, on the lower shield gap film 14 and the MR device 15, an upper shield gap film 17 made of an insulating material such as $Al_2O_3$ or $SiO_2$ is formed with a thickness of 10 to 200 nm, for example, by sputtering or the like.

Each of the above-mentioned layers constituting the reproducing head is patterned by a common etching method using a resist pattern, a liftoff method, or a method using both of them.

Next, on the upper shield gap film 17, an upper shield and lower magnetic pole layer (hereinafter referred to as lower magnetic pole layer) 18, made of a magnetic material, to be used for both the reproducing and recording heads is formed with a thickness of 0.5 to 4.0 μm, for example. The magnetic material used for the lower magnetic pole layer 18 is a soft magnetic material such as NiFe, CoFe, CoFeNi, or FeN. The lower magnetic pole layer 18 is formed by sputtering or the like.

Subsequently, on the lower magnetic pole layer 18, a recording gap layer 19 made of an insulating material such as $Al_2O_3$ or $SiO_2$ is formed with a thickness of 10 to 500 nm, for example, by sputtering or the like. Then, for forming a magnetic path, the recording gap layer 19 is partly etched away at the center part of a thin-film coil, which will be explained later, so as to form a contact hole 19*a*.

Next, a part to be formed with a thin-film coil on the recording gap layer 19 is formed with an insulating layer 20 made of a thermally cured photoresist, for example. Subsequently, on the insulating layer 20, a first layer part 21 of the thin-film coil, made of an electrically conductive material such as Cu, is formed by frame plating or the like. Then, an insulating layer 22 made of a thermally cured photoresist, for example, is formed so as to cover the insulating layer 20 and the first layer part 21 of thin-film coil. Thereafter, on the insulating layer 22, a second layer part 23 of the thin-film coil, made of an electrically conductive material such as Cu, is formed by frame plating or the like. Next, an insulating layer 24 made of a thermally cured photoresist, for example, is formed so as to cover the insulating layer 22 and the second layer part 23 of thin-film coil. The first layer part 21 and second layer part 23 are connected to each other and wound about the contact hole 19*a*. The part where the first layer part 21 and second layer part 23 are combined together has a thickness of 2 to 5 μm, for example, whereas the part where the insulating layers 20, 22, 24 are combined together has a thickness of 3 to 20 μm, for example.

Next, as shown in FIGS. 7A and 7B, an upper magnetic pole layer 25, made of a magnetic material, for a recording head is formed with a thickness of 3 to 5 μm, for example, so as to extend from the air bearing surface (medium-facing surface) S to the contact hole 19*a* over the insulating layers 22, 24. The magnetic material used for the upper magnetic pole layer 25 is a soft magnetic material such as NiFe, CoFe, or CoFeNi. The upper magnetic pole layer 25 corresponds to the metal plating layer 9 in the first embodiment, and is formed by using the pattern forming method in accordance with the first embodiment. Here, a metal film having the same composition as that of the upper magnetic pole layer 25 is formed by sputtering or the like as an electrode film (not depicted) necessary for forming the metal plating layer 9 by using the pattern forming method in accordance with the first embodiment. This metal film corresponds to the metal layer 3 in the first embodiment. Then, as in the first embodiment, the metal film is plasma-processed in an environment including a gas containing oxygen (O) and fluorine (F) atoms. The lower magnetic pole layer 18 and the upper magnetic pole layer 25 are in contact with each other at the contact hole 19*a*.

The parts of lower magnetic pole layer 18 and upper magnetic pole layer 25 facing each other by way of the recording gap layer 19 on the air bearing surface S side are magnetic pole parts of the lower magnetic pole layer 18 and upper magnetic pole layer 25, respectively. In this embodiment, the magnetic pole part of the upper magnetic pole layer 25 has a width equal to a recording track width, and defines the recording track width. The lower magnetic pole layer 18 and the upper magnetic pole layer 25 are magnetically connected to each other by way of the contact hole 19*a*.

Next, as shown in FIGS. 8A and 8B, the recording gap layer 19 is selectively etched away by dry etching while using the magnetic pole part of the upper magnetic pole layer 25 as a mask. For example, reactive ion etching (RIE) using a gas such as a chlorine type gas, e.g., $BCl_2$ or $Cl_2$, or a fluorine type gas, e.g., $CF_4$ or $SF_6$, is employed for the dry etching at this time. Subsequently, the lower magnetic pole layer 18 is selectively etched away by about 0.3 to 0.6 μm by argon ion milling, for example, so as to yield a trimmed structure shown in FIG. 8B. This trimmed structure can prevent the effective track width from increasing due to the widening of a magnetic flux occurring at the time of writing with a narrow track.

Subsequently, as shown in FIGS. 9A and 9B, a protective layer 26 made of an insulating material such as $Al_2O_3$ or $SiO_2$ is formed all over by a thickness of 5 to 50 μm by sputtering or the like, for example, and its surface is flattened, on which an undepicted electrode pad is formed. Finally, a slider including the foregoing layers is polished, so as to form an air bearing surface S of a thin-film magnetic head including a recording head and a reproducing head, thereby completing the thin-film magnetic head in this embodiment.

Thus manufactured thin-film magnetic head in accordance with this embodiment comprises a medium-facing surface (air bearing surface S) facing a recording medium, a reproducing head, and a recording head. The reproducing head has the MR device 15, and the lower shield layer 13 and upper shield layer (lower magnetic pole layer 18), disposed such that parts thereof on the air bearing surface S side oppose each other across the MR device 15, for shielding the MR device 15.

The recording head has the lower magnetic pole layer 18 and upper magnetic pole layer 25, magnetically connected to each other, including magnetic pole parts opposing each other on the air bearing surface S side and containing at least one layer each; the recording gap layer 19 disposed between the magnetic pole part of the lower magnetic pole layer 18 and the magnetic pole part of the upper magnetic pole layer 25; and the thin-film coil 21, 23 at least partly disposed between the lower magnetic pole layer 18 and upper magnetic pole layer 25 while being insulated therefrom. The magnetic pole part of the upper magnetic pole layer 25 defines a recording track width.

In this embodiment, since a magnetic pole of a thin-film magnetic head is formed by using the pattern forming method in accordance with the first embodiment, a magnetic pole finer than the size determined by an optical limit can be formed.

The other operations and effects in this embodiment are the same as those of the first embodiment.

The outline of the hard disk apparatus (magnetic recording and reproducing apparatus), head arm assembly (HAA; magnetic head apparatus), and slider (magnetic head slider) obtained by the method of this embodiment will now be explained.

Figure 10:
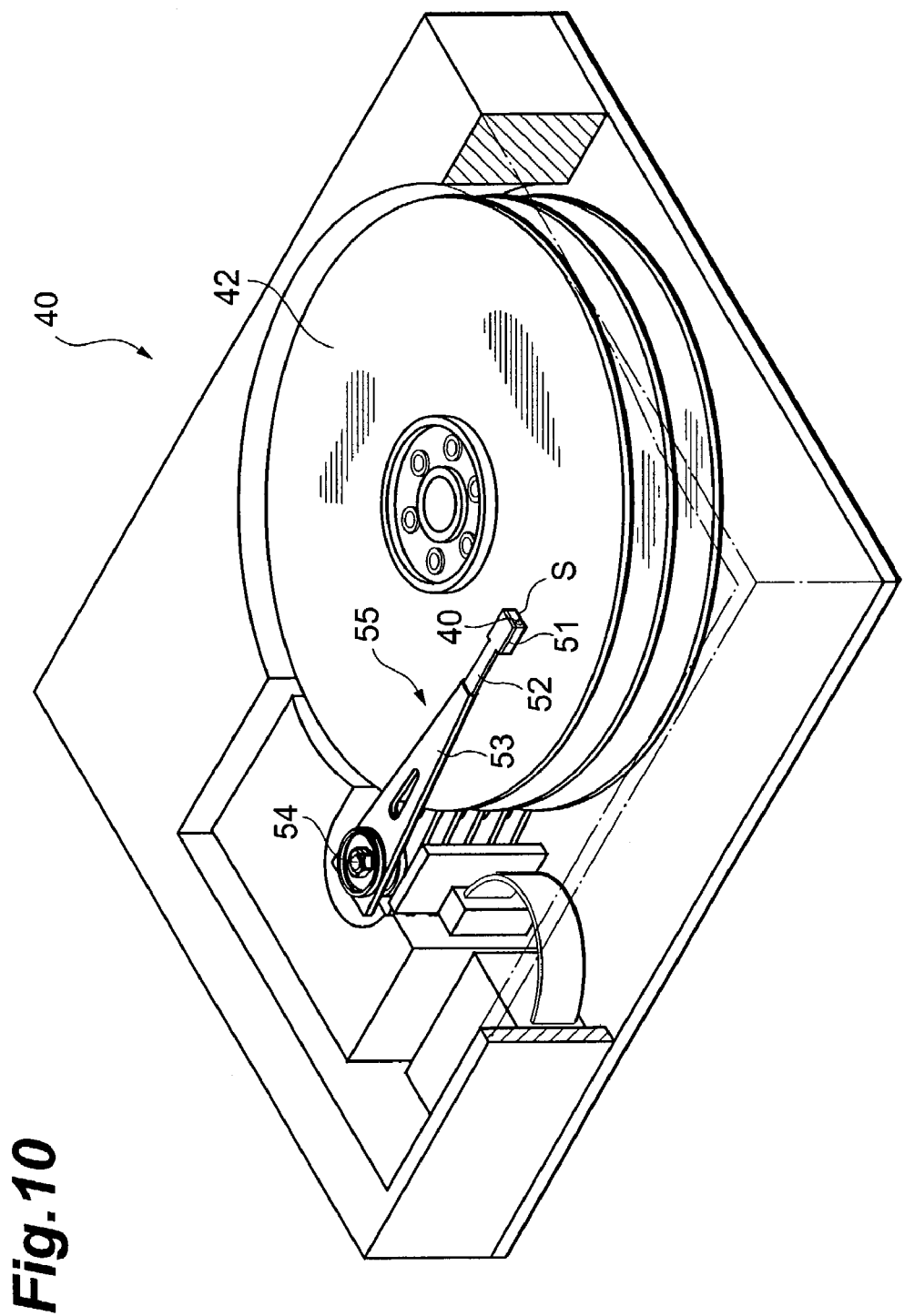
FIG. 10 is a perspective view showing a hard disk apparatus made in the third embodiment.

FIG. 10 is a view showing a hard disk apparatus equipped with the thin-film magnetic head obtained by the method of this embodiment. The hard disk apparatus 40 actuates a head arm assembly 55, so as to cause a thin-film magnetic head 50 to record and reproduce magnetic information (magnetic signals) with respect to a recording surface (upper face in FIG. 10) of a hard disk (magnetic recording medium) 42 rotating at a high speed. The thin-film magnetic head 50 is obtained by the above-mentioned method of making the same. The head arm assembly 55 comprises a gimbal (head supporting apparatus) 52 mounted with a slider 51 formed with the thin-film magnetic head 50 and a suspension arm 53 connected thereto, and is rotatable about a shaft 54 by a voice coil motor, for example. When the head arm assembly 55 is rotated, the slider 51 moves radially of the hard disk 42, i.e., in a direction traversing a track line.

Figure 11:
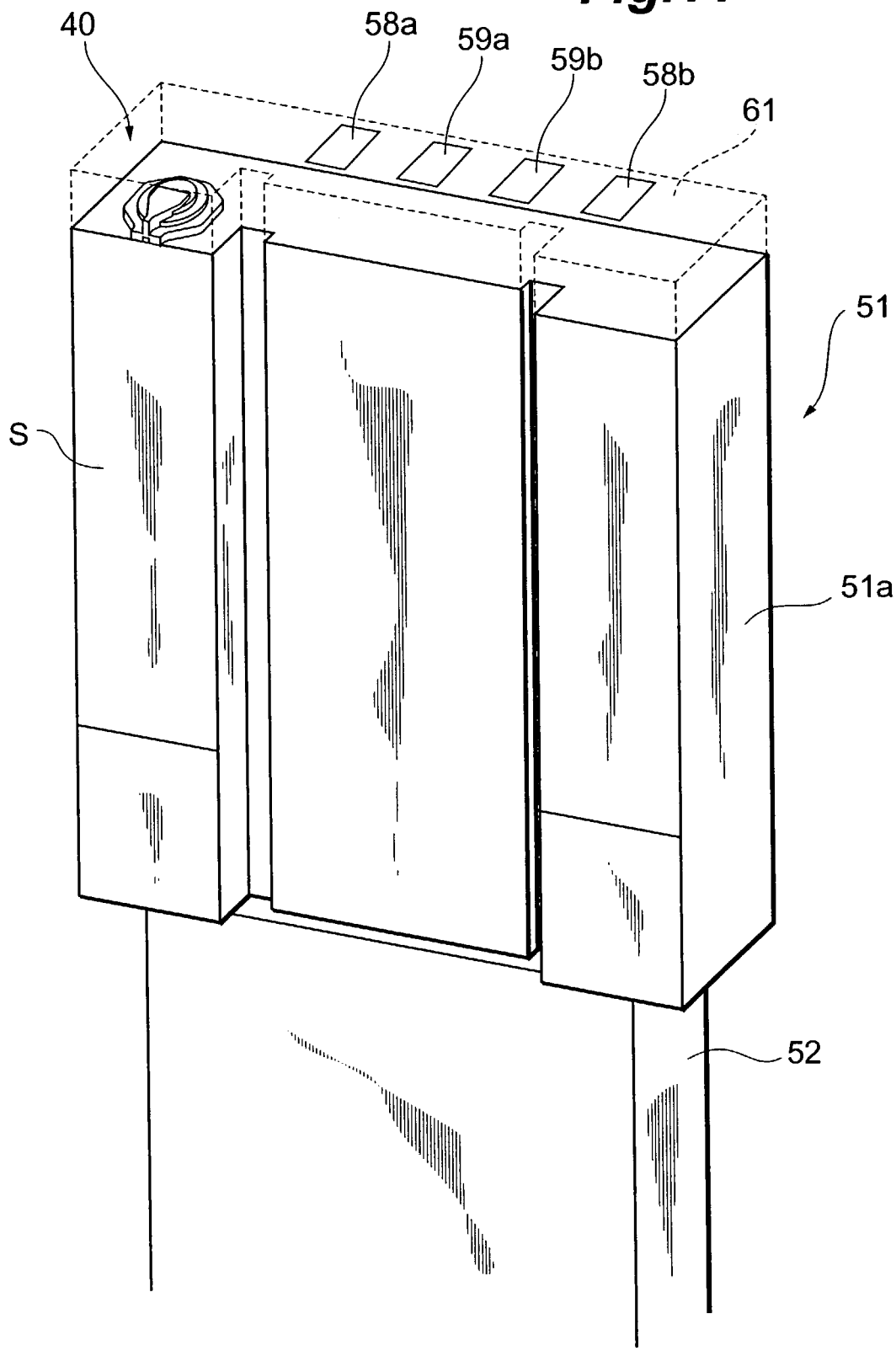
FIG. 11 is a perspective view showing a magnetic head slider in FIG. 10.

FIG. 11 is an enlarged perspective view of the slider 51. The slider 51 has a substantially rectangular parallelepiped form; and comprises a support 51a made of AlTiC ($Al_2O_3 \cdot TiC$), and the thin-film magnetic head 50 formed thereon. The surface on the front side of the drawing is a surface opposing the recording surface of the hard disk 42 and is referred to as the air bearing surface S. When the hard disk 42 rotates, the slider 51 floats up due to an air flow caused by the rotation, thereby separating the air bearing surface S from the recording surface of the hard disk 42. The thin-film magnetic head 50 is provided with recording terminals 58a, 58b and reproducing terminals 59a, 59b, whereas wires (not depicted) for inputting/outputting electric signals connected to the terminals are attached to the suspension arm 53 shown in FIG. 10. For protecting the thin-film magnetic head 50, an overcoat layer 61 indicated by broken lines in the drawing is provided. The air bearing surface S may be coated with DLC (Diamond Like Carbon) or the like.

Without being restricted to the above-mentioned embodiments, the present invention can be modified in various manners.

For example, though the same metal material is used for the metal film and the metal plating layer in the above-mentioned embodiments, metal materials different from each other may be used.

Though a thin-film magnetic head is made as a microdevice in the third embodiment, the present invention is applicable to the making of microdevices such as thin-film inductors, semiconductor devices, thin-film sensors, and thin-film actuators, and apparatus including them. That is; the present invention is applicable to the making of any microdevice in which a resist film is laminated on a metal film made of a metal material including an iron atom so as to form a resist frame, and apparatus including the same.

Though a combination thin-film magnetic head is made as a thin-film magnetic head in the third embodiment, the present invention is also applicable to a read-only thin-film magnetic head equipped with an induction type electromagnetic transducer alone or a thin-film magnetic head in which an induction type electromagnetic transducer carries out recording and reproducing.

In the present invention, as mentioned above, a magnetic film made of a metal material including an iron atom is plasma-processed in an environment including a gas containing oxygen and fluorine atoms, and a resist film is formed on the plasma-processed metal film. This prevents residual scum from occurring in the exposed part of the metal film and keeps the bottom part of resist frame near the metal film from being bellbottomed or undercut when a part of the resist film is removed so as to expose a predetermined part of the metal film. Therefore, a favorable resist frame can be obtained, whereby yield can be improved in subsequent manufacturing processes.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 2002-151339 filed on May 24, 2002 is hereby incorporated by reference.

What is claimed is:

1. A pattern forming method for forming on a substrate a resist frame having a desirable pattern on a metal film made of a metal material including an iron atom, said method comprising the steps of:

forming said metal film made of a metal material including an iron atom on said substrate;

conducting surface treatment of said metal film by plasma in an environment including a gas containing oxygen and fluorine atoms after forming the metal film;

forming a resist film on said plasma-processed metal film; and forming said resist frame by removing a part of said resist film so as to expose a predetermined part of said metal film.

2. A pattern forming method according to claim 1, wherein said resist film is formed by using a chemically amplified resist material.

3. A pattern forming method according to claim 1, further comprising the steps of:

forming a metal plating layer on said metal film by plating said exposed part of said metal film with a metal material while using said resist frame as a mask;

removing said resist frame; and removing said metal film while using said metal plating layer as a mask.

4. A pattern forming method according to claim 1, further comprising the steps of:

removing said exposed predetermined part of said metal film while using said resist frame as a mask; and removing said resist frame.

5. A method of making a microdevice comprising the steps of:

forming a metal film made of a metal material including an iron atom on a substrate;

conducting surface treatment of said metal film by plasma in an environment including a gas containing oxygen and fluorine atoms after forming the metal film;

forming a resist film on said plasma-processed metal film; and forming a resist frame by removing a part of said resist film so as to expose a predetermined part of said metal film.

6. A method of making a microdevice according to claim 5, wherein said resist film is formed by using a chemically amplified resist material.

7. A method of making a microdevice according to claim 5, further comprising the steps of:

forming a metal plating layer on said metal film by plating said exposed predetermined part of said metal film with a metal material while using said resist frame as a mask;

removing said resist frame; and removing said metal film while using said metal plating layer as a mask.

8. A method of making a microdevice according to claim 5, further comprising the steps of:

removing said exposed predetermined part of said metal film while using said resist frame as a mask; and removing said resist frame.

9. A method of making a thin-film magnetic head, wherein said thin-film magnetic head is made as the microdevice by using the method according to claim 5.

10. A method of making a thin-film magnetic head according to claim 9, further comprising the steps of:

forming a metal plating layer on said metal film by plating said exposed pretermined part of said metal film with a metal material while using said resist frame as a mask;

removing said resist frame; and removing said metal film while using said metal plating layer as a mask;

said thin-film magnetic head comprising a magnetic pole layer made of the metal material, said metal plating layer forming said magnetic pole layer.

11. A method of making a magnetic head slider comprising a thin-film magnetic head, wherein said thin-film magnetic head is made by using the method according to claim 9.

12. A method of making a magnetic head apparatus including a thin-film magnetic head and a head supporting apparatus for supporting said thin-film magnetic head, wherein said thin-film magnetic head is made by using the method according to claim 9.

13. A method of making a magnetic recording and reproducing apparatus comprising a magnetic head apparatus including a thin-film magnetic head and a head supporting apparatus for supporting said thin-film magnetic head, and a magnetic recording medium for carrying out magnetic recording and reproducing in cooperation with said thin-film magnetic head, wherein said magnetic head apparatus is made by using the method according to claim 12.

* * * * *